(12) United States Patent
Risby et al.

(10) Patent No.: US 9,293,302 B2
(45) Date of Patent: Mar. 22, 2016

(54) METHOD FOR PROCESSING A GAS AND A DEVICE FOR PERFORMING THE METHOD

(71) Applicant: GasPlas AS, Oslo (NO)

(72) Inventors: Philip John Risby, Norwich (GB); Dale Pennington, Norwich (GB)

(73) Assignee: GasPlas AS, Oslo (NO)

( * ) Notice: Subject to any disclaimer, the term of this patent is extended or adjusted under 35 U.S.C. 154(b) by 216 days.

(21) Appl. No.: 14/180,981

(22) Filed: Feb. 14, 2014

(65) Prior Publication Data

US 2014/0159572 A1 Jun. 12, 2014

Related U.S. Application Data

(63) Continuation of application No. 14/114,089, filed as application No. PCT/IB2012/052115 on Apr. 27, 2012, now abandoned.

(30) Foreign Application Priority Data

Apr. 28, 2011 (GB) .................................. 1107130.5

(51) Int. Cl.
*H01J 25/50* (2006.01)
*H01J 37/32* (2006.01)

(52) U.S. Cl.
CPC ..... *H01J 37/32449* (2013.01); *H01J 37/32192* (2013.01); *H01J 37/32201* (2013.01); *H01J 37/32357* (2013.01)

(58) Field of Classification Search
None
See application file for complete search history.

(56) References Cited

U.S. PATENT DOCUMENTS

| | | |
|---|---|---|
| 4,611,108 A | 9/1986 | Leprince et al. |
| 5,206,471 A | 4/1993 | Smith |
| 5,349,154 A | 9/1994 | Harker et al. |
| 6,982,395 B2 * | 1/2006 | Bayer ................... H05H 1/30 219/121.45 |
| 8,776,719 B2 * | 7/2014 | Radoiu ............. H01J 37/32192 118/723 MW |
| 2004/0149700 A1 * | 8/2004 | Bayer ................... H05H 1/30 219/121.46 |

FOREIGN PATENT DOCUMENTS

| | | |
|---|---|---|
| EP | 0461683 A2 | 12/1991 |
| EP | 1 936 656 A1 | 6/2008 |
| GB | 1149473 A | 4/1969 |
| WO | 96/41505 A1 | 12/1996 |
| WO | 2006/037991 A2 | 4/2006 |
| WO | 2007/086875 A1 | 8/2007 |
| WO | 2010/094969 A1 | 8/2010 |
| WO | 2010/094972 A1 | 8/2010 |

OTHER PUBLICATIONS

International Search Report issued in PCT/IB2012/052115 mailed on Oct. 2, 2012 (2 pages).
Written Opinion of the International Searching Authority issued in PCT/IB2012/052115 mailed on Oct. 2, 2012 (8 pages).
International Preliminary Report on Patentability from PCT/IB2012/052115 issued on Mar. 27, 2012 (13 pages).
Combined Search and Examination Report under Sections 17 and 18(3) from Application No. GB1107130.5 issued on Sep. 8, 2011 (5 pages).
Jasiński, M. et al.; "Hydrogen Production Via Methane Reforming Using Various Microwave Plasma Sources"; Chem. Listy, 102, (2008), pp. s1332-s1337 (6 pages).

* cited by examiner

*Primary Examiner* — Tung X Le
*Assistant Examiner* — Srinivas Sathiraju
(74) *Attorney, Agent, or Firm* — Osha Liang LLP

(57) ABSTRACT

A method and device for processing a gas by forming microwave plasmas of the gas. The gas that is to be processed is set in a two or three co-axial vortex flow inside the device and exposed to a microwave field to form the plasma in the inner co-axial vortex flow, which subsequently is expelled as a plasma afterglow through an outlet of the device.

13 Claims, 5 Drawing Sheets

METHOD FOR PROCESSING A GAS AND A DEVICE FOR PERFORMING THE METHOD

CROSS-REFERENCE TO RELATED APPLICATIONS

This patent application is a continuation of U.S. application Ser. No. 14/114,089, filed on Oct. 25, 2013, which is a national phase application of international application number PCT/IB2012/052115, filed on Apr. 27, 2012, and claims priority to United Kingdom Patent Application No. 1107130.5, filed on Apr. 28, 2011, the entire contents of which are hereby incorporated by reference.

TECHNICAL FIELD

The present invention relates to a method for processing a gas and a device for performing the method. More specific, the present invention relates to a method and device for processing a gas by exposure to non-thermal microwave plasmas.

BACKGROUND

Plasmas, which are more or less ionized gases, are electrically conductive fluids which may have a wide range of energy densities and electron temperatures. Plasmas have thus found extensive use in industrial processes involving cracking, dissociation and deposition as well as gas polishing. Examples of industrial processes employing plasmas include i.e. thin film deposition, plasma chemistry, plasma spray and bulk materials work, materials synthesis, welding, fusion etc.

Plasma properties are usually measured in terms of density (electrons per cubic meter) and electron temperature (which may be measured in K or electron volts). The latter being a direct measure of the degree of ionization, i.e. that proportion of the atoms that have lost an electron. Plasma density and temperature can vary considerably; density from $10^{-3}$ to $10^{+30}$ particles per cubic meter and temperature from 0 K to $10^{+8}$ K. Plasma lifetimes are also an important measure and may also have very wide range, typically from $10^{-12}$ to $10^{+17}$ seconds. It can therefore be seen that the term "plasma" can represent an extremely wide range of conditions, and for any particular application, it is important to specify the type of plasma being used.

Various forms of plasma are known to exist, generally categorised by their energy characteristics: principally thermal plasmas and non-thermal plasmas.

Thermal Plasmas (TP)

Thermal plasmas have electrons and heavy particles (ions and neutrals) at the same temperature, i.e. they are in thermal equilibrium. Thermal plasmas are readily produced, for example by electric arc, and so are easily scalable from a few tens of watts to several megawatts. Typically, they require high energy input for given reaction result as the entire mass of plasma is heated with associated thermal losses and problems of handling and containment.

The effect of thermal plasmas is to simply increase the total energy content and weight average temperature of the process products. As a result, a new equilibrium composition of the components is established according to the plasma energy contribution, whose effect in this case is quantitatively identical to the effect of a thermal energy contribution of the same value.

Non-Thermal Plasmas (NTP)

Non-thermal plasmas are not in thermodynamic equilibrium, thus the effect of the plasma results in a thermodynamically non-equilibrium composition of the process products. Usually the ion temperature in NTP's is different from the electron temperature, the electrons being 'hotter' than the heavy particles. For this reason, NTP's are also referred to as "cold plasma" or "non-equilibrium plasma" in the literature.

NTP's may be produced using a number of techniques, including electrical discharge in a vacuum (barrier discharge) capacitive and inductive coupled plasmas, as well as radio-frequency (RF) and microwave electromagnetic methods.

While thermal plasmas can operate at any pressure, NTP's prefer to operate at low or near vacuum conditions, some forms only operate at low pressure, while others, such as microwave produced plasmas can operate at high pressure (atmospheric).

NTP's at low pressure are relatively easy to create in larger volumes and to initiate as the damping effect of surrounding heavy particles is minimized, however, the plasma density is also limited, thus limiting their commercial value (residency times need to be greater). High pressure NTP's operating at near or above atmospheric pressure are continually damped by the proximity of the surrounding heavy particles (atoms) and so require greater formation energy. However, a high intensity plasma results in a more versatile and commercially viable plasma reactor as residency time is short and continuous operation is possible. Thus, strong non-equilibrium, high energy high pressure plasmas which may be obtained by microwave non-thermal plasmas are desirable.

Microwave Non-Thermal Plasmas

Microwave NTP's are particularly effective for plasma chemistry because they require relative low energy input to form highly reactive plasmas due to low thermal losses and strong catalytic effects of the high electron temperatures. Also, NTP's give no contamination from the electrode when they are made by electrode-less nozzle designs.

Microwave NTP's are notably difficult to produce in homogenous volumes, unlike barrier discharge systems that can be designed over larger areas, however, microwave NTP's are more efficient in terms of energy coupling but are constrained by the size of the microwave source (magnetron). Magnetrons operating with power exceeding 1 kW in the GHz frequency range are able to maintain the steady state microwave discharges at atmospheric pressure. At low and intermediate pressures the plasma is strongly non-equilibrium—the temperature of the neutral component ($T_g$=300 K) is less than the electron temperature ($T_e$~1-2 eV).

Most of the large-scale plasma chemical applications require high power and high pressure for high reactor productivity. It is also important to have a high degree of non-equilibrium with high electron temperature and density to support selective chemical processes. Therefore, it is necessary to have a powerful discharge that generates non-equilibrium plasma for chemical applications with both high efficiency and selectivity.

PRIOR ART

It is known to distribute the microwave energy formed in a magnetron or other microwave energy source in a plurality of plasma generators. Each plasma generator employs the portion of the microwave energy being transferred to the generator to generate a microwave induced plasma stream.

EP 0 461 683 A2 discloses an apparatus for plasma treatment, capable of plasma-treating works of resin material by irradiating the surfaces of the works with a microwave discharge plasma within a vacuum reaction chamber, which comprises a plurality of long plasma-irradiating tubular pipes, each of which is provided along the length thereof with numerous small holes for injecting plasma, and at least one plasma-irradiating straight pipe disposed with its free end opening toward a section to which the plasma is hard to flow. At least one second plasma-irradiating pipe is located movably to an optional position within the reaction chamber.

WO 2007/086875 discloses a work processing system S which is provided with a plasma generating unit PU including a microwave generator for generating microwaves of 2.45 GHz, a waveguide for causing the microwaves to travel and a plasma generator mounted on a surface of the waveguide facing a work W; and a work conveyor C for conveying the work W to pass the plasma generator. The plasma generator includes a plurality of arrayed plasma generating nozzles for receiving the microwaves, generating a plasma-converted gas based on a receiving electrical energy and discharging the generated gas. The plasma-converted gas is blown to the work W in the plasma generator while the work W is conveyed by the work conveyor C. It is possible both to successively plasma-process a plurality of works and to efficiently plasma-process works having large areas.

EP 1 936 656 discloses a plasma generator for cleaning an object. The plasma generator comprises a plasma chamber and a support structure arranged in the plasma chamber for supporting the object to be cleaned. Further, the plasma generator comprises an electromagnetic shield counteracting a flow of charged plasma particles flowing from a plasma generating region towards the object, and a plasma source. In addition, the plasma generator comprises an additional plasma source to form a composition of plasma sources that are arranged to generate in the plasma generating region plasmas, respectively, that mutually interact during operation of the plasma generator so as to force plasma particles to flow in a diffusely closed flow path.

It is also known to employ more than one microwave energy sources to increase the energy density of the microwave induced plasma in the reactor.

WO 2010/094969 discloses a plasma reactor which has a reaction chamber and one or more plasma sources in fluid communication with the reaction chamber. A fluid including a material to be ionised is supplied to the plasma sources so that the ionised material in the form of a plasma generated by the plasma sources is collected in a reaction region of the reaction chamber. The reactant products are collected from the reaction chamber so as to enable continuous operation of the plasma reactor. Additionally, the plasma reactor is adapted to maintain particulates in suspension within the reaction chamber which broadens the range of processes for which the plasma reactor is suitable and improves the efficiency of such processes.

WO 2010/094972 discloses a plasma reactor with a plurality of microwave plasma nozzles and a common reaction chamber. A fluid including a material to be ionised is supplied to the plasma nozzles and each plasma nozzle is connected to an inlet to the reaction chamber so that plasma generated within the nozzle is fed through the inlet and is collected within the reaction chamber. The plasma reactor is capable of being scaled up through the simultaneous use of multiple individual plasma nozzles and is thus suitable for use in the processing of a wide variety of feed materials and at commercial scales.

The use of two or more plasma generators on a plasma reactor, each generator with their separate microwave energy source, requires a solution to the problem with destructive interference between the microwave fields of the energy sources in the plasma reactor. It is necessary to employ a plasma nozzle capable of generating and transferring the microwave induced plasma from the nozzle into the plasma reactor in a manner which prevents the microwave energy to penetrate into the plasma reactor.

U.S. Pat. No. 5,206,471 discloses a microwave activated gas generator in which microwave energy is supplied to an activated gas formation region through which a gas to be activated flows in a high-velocity stream. The stream is disturbed within or proximate the activation region to form a downstream stagnation region within the activated gas formation region to encourage microwave gas activation for efficiently coupling power to the gas to form a high-volume, high-velocity activated gas stream.

US 2004/0149700 discloses a method for generation of microwaves in a high-frequency microwave source, guidance of the microwaves in a wave guide (1), introduction of a process gas at a pressure of p>=1 bar into a microwave-transparent tube (2) which comprises a gas inlet opening (4) and a gas outlet opening (3), the process gas being introduced through the gas inlet opening (4) into the microwave-transparent tube (2) in such a way that it has a tangential flow component, generation of a plasma (7) in the microwave-transparent tube (2) by means of electrode-less ignition of the process gas, generation of a plasma jet (17) by means of the introduction of the plasma (7) into the working space (16) through a metallic expansion nozzle (5); arranged at the gas outlet opening (3) of the tube (2). A facsimile of FIG. 2 of the document is presented in FIG. 1.

OBJECTIVE OF THE INVENTION

The main objective of the invention is to provide a method and device for continuously forming a microwave induced plasma of a gas phase being fed to the device and transferring the plasma and gas phase to a reactor space while confining the microwave radiation to the interior of the device.

A further objective of the invention is to provide a method and a plasma generating device with effective processing of the gases and thus high conversion rates to plasma and enhanced plasma stability.

The objectives of the invention may be achieved by the features as set forth in the description below and in the appended claims and figures.

DESCRIPTION OF THE INVENTION

The invention is based on the realisation that an improved conversion rate of a gas exposed to microwave energy may be obtained by forming a recirculated bypass flow of the gas that is to be processed formed into a double vortex flow around the plasma generating zone, and that an effective confinement of the microwave radiation may be obtained by employing an gas/plasma exit channel of the device with characteristic dimensions less than a certain fraction of the wavelength of the standing microwave.

Thus in a first aspect, the present invention relates to a method for processing a gas, wherein the method comprises;
employing an elongated vessel with an inner space of cylindrical symmetry, where the elongated vessel:
i) protrudes through a microwave chamber,
ii) the walls of the part of the elongated vessel not in contact with the microwave chamber is opaque to microwave radiation,
iii) the walls of the part of the elongated vessel which penetrates into the microwave chamber is transparent to microwave radiation,
iv) the elongated vessel has at first end of the vessel a co-axial elongated cylindrical exit channel with an inner diameter, D, equal to or less than a factor of $\frac{1}{16}$ of the wavelength of an applied microwave field within the microwave chamber, and a length, E, equal to or less than a factor of $(n+1/8)$, $n \in \{0, 1, 2, 3\}$, of the wavelength of an applied microwave field within the microwave chamber, and v) the elongated vessel is closed at the second end opposite the first end by a bottom wall, injecting the gas that is to be processed such that it forms a first vortex flow running along the inner wall of the inner space of the vessel and then reflects from the bottom wall at the second end to form a second vortex flow of the gas that is to be processed running along the centre axis of the vessel from the bottom wall of the vessel and out of the exit channel at the first end, and forming a standing microwave in the microwave chamber aligned to form a wave crest at the centre axis of the vessel in the area of the vessel where it is transparent to microwave energy with sufficient intensity to excite at least a portion of the gas in the second vortex to form a microwave non-thermal plasma.

In a second aspect, the present invention relates to a device for processing a gas, where the device comprises:

a microwave chamber enabling forming a standing microwave within the chamber and which is coupled to a source for microwave radiation, and an elongated vessel with an inner space of cylindrical symmetry, where the elongated vessel protrudes through the microwave chamber such that the longitudinal centre axis of the vessel is oriented substantially normal to the propagation direction of a standing microwave in the microwave chamber, the walls of the part of the elongated vessel not in contact with the microwave chamber is opaque to microwave radiation, the walls of the part of the elongated vessel which penetrates into the microwave chamber is transparent to microwave radiation, and the elongated vessel is closed at a second end opposite the first end by a bottom wall, characterised in that the elongated vessel has at the first end a co-axial elongated cylindrical exit channel with an inner diameter, D, equal to or less than a factor of 1/16 of the wavelength of an applied microwave field within the microwave chamber, and a length, E, equal to or less than a factor of $(n+1/8)$, $n \in \{1, 2, 3\}$, of the wavelength of an applied microwave field within the microwave chamber, and the elongated vessel has an inlet for injection of the gas that is to be processed located at a position in proximity of the first end of the vessel, and which injects the gas such that a first vortex flow running along the inner wall of the inner space of the vessel to the bottom wall of the second end, and then reflects from the bottom wall to form a second vortex flow of the gas running along the longitudinal centre axis of the vessel from the bottom wall of the vessel and out of the exit channel at the first end, and the elongated vessel penetrates through the microwave chamber in a position such that the standing microwave within the microwave chamber has a wave crest at the longitudinal centre axis of the elongated vessel.

The confinement of the microwave radiation to the interior of the elongated vessel (and microwave chamber) according to the invention is obtained by a choking effect of the cavity in the exit channel defined by the characteristic dimensions of the exit channel should be employed to obtain an effective elimination of microwave energy leakage through the exit channel and thus into the reactor space. The choking cavity is found to be effective when the inner diameter, D, of the exit channel is equal to or less than a factor of 1/16 of the wavelength of the applied microwave field within the microwave chamber, and a length, E, equal to or less than a factor of $(n+1/8)$, $n \in \{0, 1, 2, 3\}$, of the wavelength of the applied microwave field within the microwave chamber.

However, due to the mixtures of modes of the microwave radiation resulting from the geometry of the elongated vessel, it is experienced that a second microwave choking obtained by the characteristic dimensions L and W, which are the length and width, respectively of the elongated vessel, may advantageously be employed to obtain a more effective elimination of microwave energy leakage through the exit channel and thus into the reactor space. The second choking effect is found to be satisfactory effective when the length, L, is equal to or less than 1/4 of the wavelength of the standing microwave within the microwave chamber and the width, W, is equal to or less than 1/8 of the wavelength of the standing microwave within the microwave chamber. With these characteristic dimensions, it is observed that the microwave radiation will be effectively reflected from the walls of the elongated vessel and substantially prevent microwave radiation from escaping (leaking) through the exit channel for the more or less excited plasma gas. The term "Length L" as used herein means the shortest distance in space between the plane defined by the points on the periphery of the lower end of the cylindrical exit channel and the plane defined by the points along the periphery of the highest end of the microwave transparent section of the wall of the elongated vessel.

The term "wavelength" as used herein means the spatial period of the wave, which is the distance between consecutive corresponding points of the same phase of the oscillating microwave in the microwave chamber. The term "substantially normal" as used herein means that the orientation of the elongated vessel is aligned to make the centre axis of the elongated vessel approximately perpendicular to the propagation direction of the velocity vector of the microwave field within the microwave chamber. Approximately perpendicular corresponds to an angle in the range from 80-100°.

The invention according to the first and second aspect is schematically illustrated in FIG. 2, which is a cross-section view along the centre axis of the elongated vessel. Reference number 100 is the opaque walls of the elongated vessel, 102 is the inner space with cylindrical symmetry, 103 is the first end of the inner space, 104 is the second end of the inner space, 105 is the exit channel, 106 are inlets for injecting the gas that is to be processed and form the first vortex flow (means for forming the vortex is not shown), 107 is a truncated illustration of the microwave chamber, 108 is the wall segment of the vessel that is transparent to microwave radiation, and 109 is the microwave induced plasma. The centre axis of the elongated vessel is illustrated as the dotted line between A and A'. The plane defined by the points along the periphery of the highest end of the microwave transparent wall section 108 is marked by a dashed line marked P. The length, L of the choking cavity defined by the interior dimensions of the elongated vessel is indicated with two vertically oriented arrows marked L, while the width, W of the choking cavity is indicated by two horizontally oriented arrows marked W. The inner diameter, D of the exit channel is indicated by two horizontally oriented arrows marked D, and the length, E of the exit channel is indicated by two vertically oriented arrows marked E.

The objectives of the method and device according to the invention are obtained by injecting the gas that is to be processed such that it forms a first vortex flow along the inner walls of the elongated vessel. The gas in the first vortex will act as a thermal energy shield protecting the walls (100 and 108) from being directly exposed to the microwave induced plasma by absorbing the heat/energy escaping from the plasma zone. This has the advantageous effect of pre-heating the gas that is to be processed such that a larger portion of the gas will be sufficiently excited when it enters the plasma generating zone 109 when flowing upwards in the second vortex along the centre axis. This feature increases the energy efficiency of the process, and thus enhances the commercial viability of microwave plasmas. The coaxially opposite oriented double vortex flow inside the elongated vessel is also advantageous in that the first vortex flow functions as a stabiliser which confines the gas in the second vortex to flow in the centre space of the vessel, and thus improve the contact between the microwave energy and the gas that is to be processed.

There may also be applied a third vortex flow inside the elongated vessel to further enhance the thermal energy shield effect protecting the walls of the vessel from the microwave energy, the preheating effect on the gas before entry into the plasma forming zone, and the confinement effect (the centre co-axial vortex flow is prevented from expanding laterally) which further increases the energy efficiency of the process. To realise three co-axial vortex flows inside the elongated vessel, the gas needs to be introduced and set into a swirl motion at the second end (opposite the first end where the exit channel is located) of the vessel. The swirling gas in the first vortex flow must when it reaches the first end of the vessel be deflected to flow in the reversed direction (back towards the second end). This may i.e. be obtained by having a curved wall segment forming an annular semi-tube etc. at the peripheral section of vessel at the first end. The gas being deflected at the first end forms a second vortex flow flowing co-axially in the opposite direction and inside of the first vortex flow until the gas reaches the second end. There the gas is to be deflected a second time to form a third vortex flow flowing co-axially in the opposite direction and inside of the second vortex flow. The third vortex flow is flowing along the centre axis of the elongated vessel and exits through the exit channel. The standing microwave in the microwave chamber should be made to have a crest at the centre axis such that the gas flowing in the third vortex flow becomes excited and heated to form a plasma by the microwave energy.

An example embodiment employing three co-axial vortex flows is schematically illustrated in FIG. 3, which is a cross-section view along the centre axis of the elongated vessel. Reference number 200 is the opaque walls of the elongated vessel, 202 is the inner space with cylindrical symmetry, 203 is the first end of the inner space, 204 is the second end of the inner space, 205 is the exit channel, 206 are inlets for injecting the gas that is to be processed and form the first vortex flow (means for forming the vortex is not shown), 207 is a truncated illustration of the microwave chamber, 208 is the wall segment of the vessel that is transparent to microwave radiation, 209 is the microwave induced plasma, and 210 is the curved wall segment. The plane defined by the points along the periphery of the highest end of the microwave transparent wall section 108 is marked by a dashed line marked P. The length, L of the choking cavity defined by the interior dimensions of the elongated vessel is indicated with two vertically oriented arrows marked L, while the width, W of the choking cavity is indicated by two horizontally oriented arrows marked W. The inner diameter, D of the exit channel is indicated by two horizontally oriented arrows marked D, and the length, E of the exit channel is indicated by two vertically oriented arrows marked E. The specifications of the characteristic lengths D, E, L, and W are the same for the embodiment with three co-axial vortex flows as the specifications given above for the embodiment with two co-axial vortex flows. The flow directions of the swirling gas in the first, second, and third vortex flows are indicated by the thick arrows.

The term "centre axis" as used herein means the rotational axis of the cylindrical symmetric inner space of the vessel. It should be remarked that it is only the inner space of the elongated vessel and the exit channel that need to have cylindrical symmetry over rotational axis A-A'. The other components of the device may be asymmetric or have other types of symmetry.

The term "in proximity of the first end of the vessel" as used herein means a location on the microwave opaque wall segment of the elongated vessel somewhere between the first end and the plane P.

The term "first vortex flow" as used herein means a flow of the gas which is to be processed that is spinning along the inner wall of the inner space of the vessel from the inlet towards the bottom section of the vessel. The term "second vortex flow" as used herein means a spinning gas and plasma flow confined to the centre axis aligned space defined by the low pressure zone of the first vortex flow and which results by the reflection of the gas flowing in the first vortex flow when it hits the bottom section of the vessel. The second vortex flow will thus be located in the centre of the first vortex flow, but be running in the opposite direction from the bottom section of the vessel and out of the exit opening at the first end. The double layer vortex flow of the first and second vortex flow resembles thus the fluid flow in cyclone separators, with the exception that there is no exit opening in the bottom section.

The term "bottom wall" as used herein means the bottom enclosure of the inner space of the vessel at the second end, and which is able to reflect the incoming gas of the first vortex flow and form the second vortex flow. The invention may apply any known or conceivable design of the bottom wall which is able to form the double vortex structure. However it is advantageous to employ a bottom wall designed to provide a smooth transition of the vertical velocity component of the gas flowing in the first vortex flow to a more or less horizontal velocity component to obtain a convergence zone around the centre point of the bottom wall which forces the gas to form the upwardly oriented second vortex flow along the centre axis. This feature is obtained by a bottom element of the vessel with an inner wall shaped to form a curved conical closure with cylindrical symmetry of the inner space. The curved conical closure may have any curvature as formed by the intersection of a vertical plane through the centre axis, such as i.e. one of semi-circular, semi-elliptic and parabolic.

The term "microwave chamber" as used herein means any known or conceivable enclosure capable of containing and creating a standing wave of microwave radiation in the interior of the enclosure. An example of a suitable and much used microwave chamber is a rectangular parallelepiped with walls that is opaque and capable of reflecting the microwaves and which forms an inner cavity with dimensions corresponding to an eigenvalue of the microwave radiation. This example of microwave chamber is also denoted waveguide. When applying this form of microwave chamber, the elongated vessel should penetrate through the microwave chamber at a location where the standing microwave inside the microwave chamber has a wave crest, and be positioned such that the microwave transparent mid-section of the vessel is in the interior of the microwave chamber. Hence, a high intensity zone of microwave energy inside the elongated vessel will be formed to contact and excite a gas streaming through the elongated vessel. The invention may apply any known or conceivable microwave chamber, such as i.e. a co-axial cable etc.

The microwave chamber is connected to a microwave generator which feeds microwave radiation into the chamber. The invention may apply any known or conceivable microwave chamber and microwave source, such as i.e. a magnetron. The microwave plasma generator may advantageously be a coaxial magnetron supplied with an energy between 0.1 kW and 500 kW, more preferably 0.5 kW to 120 kW, most preferably 1 kW to 75 kW. The frequencies of the microwave radiation may advantageously be in the range from 0.6 GHz to 10 GHz, preferably from 0.9 GHz to 2.5 GHz. The latter corresponds to a wavelength of 33 to 12 cm, respectively.

The material of the opaque walls of the elongated vessel may be any known or conceivable material capable of withstanding the heat, pressures and chemical environment associated with forming non-thermal plasmas of a gas. Examples of suitable materials include, but are not limited to metals or alloys such as brass, copper, steel, aluminium, ceramics such as alumina. It may be employed active cooling of the walls, by i.e. having channels in the bulk volume if the walls with circulating coolants or any other form of known or conceivable cooling of solid materials.

The materials of the walls of the mid-section of the elongated vessel may be of any conceivable material capable of withstanding the heat, pressures and chemical environment associated with forming non-thermal plasmas of a gas. Examples of suitable materials include, but are not limited to polytetrafluoroethylene, a low dielectric (having a relative permittivity of less than 10) ceramic such as boron nitride, quartz, silica, alumina, etc.

The invention may apply any known or conceivable method for forming the first vortex flow, such as having a vortex inducer in the inlet section of the inner space of the elongated vessel, employing tangential injection of the gas into the inner space of the elongated vessel setting the gas in a downwardly oriented helical flow along the inner wall etc. One example of flow inducer is two, four, six, etc. air knives placed in an annular channel in the wall of the elongated vessel. The annular channel is located in a proximal distance from the first end and aligned symmetric around the centre axis, while the air knifes is formed by inserting a number equal to m, where $m \in \{1, 2, 3, 4, 5, 6, 7, 8, 9, 10\}$ pieces of a solid body, each dimensioned to form a gas tight enclosure with the walls of the annular channel and to create the same number of slits in-between the solid bodies as the number of bodies being applied in the annular channel. Each slit will form a tangentially oriented flow channel for the gas being injected. The applied gas pressure may advantageously provide a gas velocity in the air knives at a range of 1-100 l/min (corresponds to 2-320 m/s), while the cross sectional area of the slit may advantageously be from $1 \times 0.001$ mm$^2$ to $30 \times 0.5$ mm$^2$, preferably $5 \times 0.005$ mm$^2$ to $25 \times 0.25$ mm$^2$ diameter, and more preferably from $10 \times 0.01$ mm$^2$ to $20 \times 0.15$ mm$^2$. The corresponding gas pressure is in the range from 0.10 to 0.45 megapascal (MPa).

The feature of applying the plasma afterglow to process the components of the gas provides an advantage in that the external energy source (the microwave field) is absent such that the plasma-generated species de-excite and participate in secondary chemical reactions that tend to form stable species. Depending on the gas composition, super-elastic collisions may continue to sustain the plasma in the afterglow for a while by releasing the energy stored in the atoms and molecules of the plasma. Especially in molecular gases, the plasma chemistry in the afterglow is significantly different from the plasma. While the chemistry in the plasma plume relates to the breaking of molecular bonds, that in the afterglow zone relates to the formation of new bonds. Afterglow chemistry and control of conditions such as amount of energy, energy gradient, solubility of products/reactants, substrates, catalysts, etc. in the afterglow region may be advantageous by improving the control of the formation, quality and selectivity of the desired reaction products.

A plasma afterglow can either be temporal, due to an interrupted (pulsed) plasma source, or a spatial one, due to a distance from the plasma source. In the present invention it is employed a plasma afterglow formed by a spatial separation obtained by the design of the device with the mid-section of the elongated vessel located inside the microwave chamber and the exit channel with a choking effect on the microwave energy.

In addition, the design or more precisely, the geometry of the exit channel may be varied to regulate the width and length of the plasma afterglow exiting the exit channel. This yields the ability to extend the plasma out of the microwave chamber and into a reactor space. For example, decreasing the diameter of exit channel decreases the diameter of the plasma/gas vortex flow and thus increases the length of the plasma zone. This allows moving the plasma further away from the walls of the elongated vessel and thus reducing thermal degradation and at the same time extending the plasma and therefore the afterglow region further from the microwave field. This makes it possible to apply more than one device, each equipped its own microwave generator (magnetron etc.), to feed plasma afterglow into a single reactor space without being encumbered with the problem of destructive interference between the microwave fields of the microwave generators. This feature makes the device according to the second aspect of the invention well suited for use in the plasma reactors disclosed in WO 2010/094969 and WO 2010/094972.

The choking effect of the nozzle will be satisfactory with any diameter of the exit channel larger than zero but smaller than $1/16$ of the wavelength of the standing microwave within the microwave chamber. However, in practice, it will be advantageous to balance between the need for forming an effective choking cavity and the need for having an efficient flow capacity of the outlet for the gas/plasma afterglow of the second vortex flow, such that the diameter, D, of the exit channel may advantageously be in one of the following ranges; from a factor of $1/64$ to $1/16$, from a factor of $1/32$ to $1/16$, or from a factor of $1/24$ to $1/16$ of the wavelength of the standing microwave within the microwave chamber. The length, E, of the exit channel may correspondingly have one of the following ranges; from than a factor of $(n+1/32)$ to $(n+1/8)$, from than a factor of $(n+1/16)$ to $(n+1/8)$, or from than a factor of $(n+1/12)$ to $(n+1/8)$, $n \in \{0, 1, 2, 3\}$, of the wavelength of the standing microwave within the microwave chamber.

Also, the second microwave choking effect obtained by the characteristic dimensions L and W of the elongated vessel may advantageously be balanced between the need for forming an effective choking cavity and the need for having space to form efficient flow volumes of the first and second vortex flows, such that the width, W, of the choking cavity in the inner space of the elongated vessel may advantageously be in one of the following ranges; from a factor of $(n+1/32)$ to $(n+1/8)$, from a factor of $(n+1/16)$ to $(n+1/8)$, or from a factor of $(n+1/12)$ to $(n+1/8)$, $n \in \{0, 1, 2, 3\}$, of the wavelength of the standing microwave within the microwave chamber. The length, L, of the choking cavity in the inner space of the elongated vessel correspondingly have one of the following ranges; from a factor of $(n+1/16)$ to $(n+1/4)$, from a factor of $(n+1/8)$ to $(n+1/4)$, or from a factor of (n+⅙) to (n+¼), n∈{0, 1, 2, 3}, of the wavelength of the standing microwave within the microwave chamber.

The invention is suited for decomposing hydrocarbons to particulate carbon and hydrogen gas. Examples of suited gases include, but are not limited to, natural gas, methane, ethane, propane, butane, etc.

LIST OF FIGURES

FIG. 4a) is a schematic cross-section drawing of an example embodiment of the present invention.

FIGS. 4b) and c) are schematic cross-section drawings showing alternative designs of the exit channel which may be implemented in the example embodiment of FIG. 4a).

Figure 5:
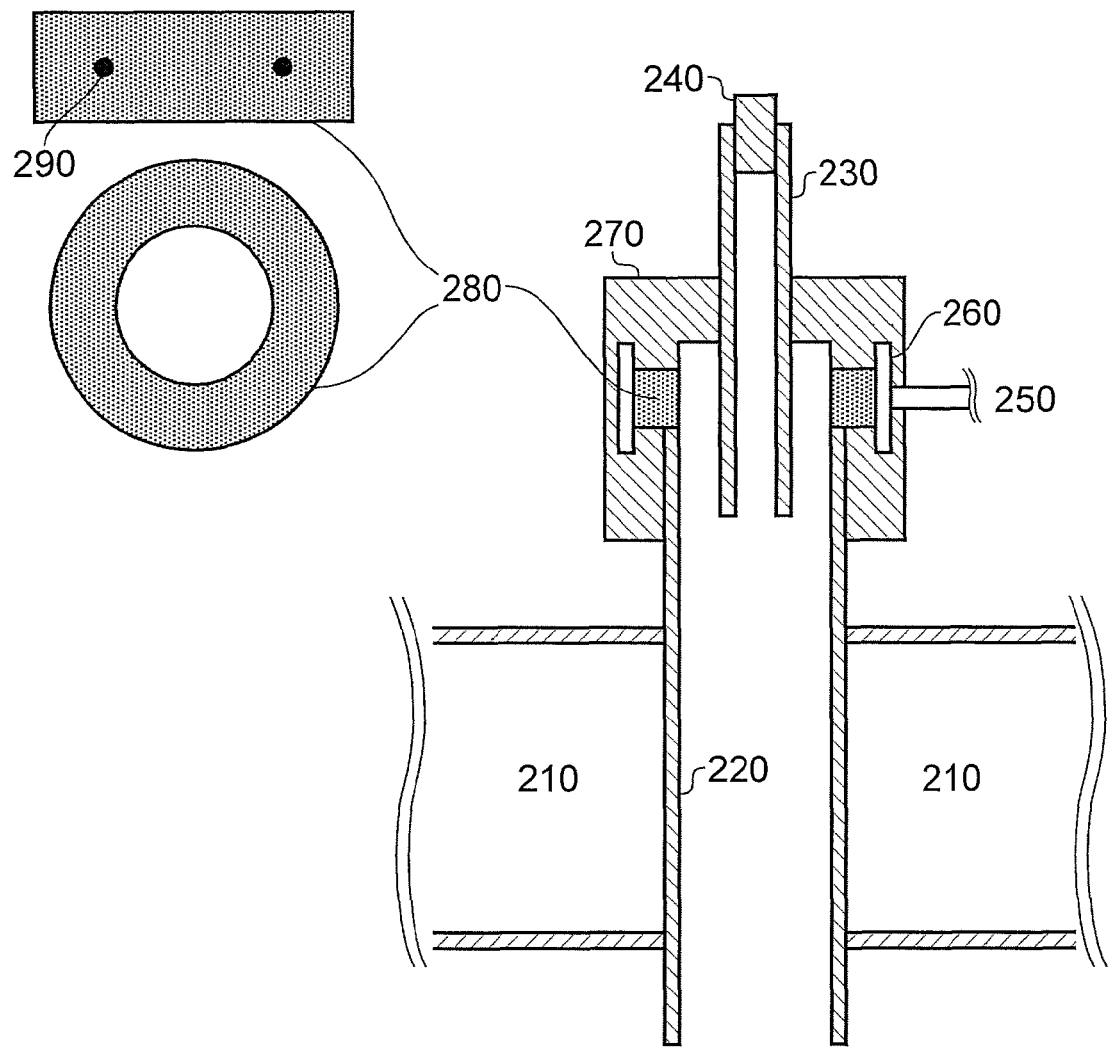

FIG. 5 is a schematic drawing of a prior art plasma nozzle employed in comparison tests.

DETAILED DESCRIPTION OF THE INVENTION

The invention will be described in greater detail by way of an example embodiment and a comparison test verifying the effect of one of the example embodiment. The example embodiment should by no mean be interpreted as a limitation of the scope of the present invention of employing two or three co-axial vortex flows to form and stabilise the plasma and use of the plasma afterglow to process the gas.

Example Embodiment

Figure 1:
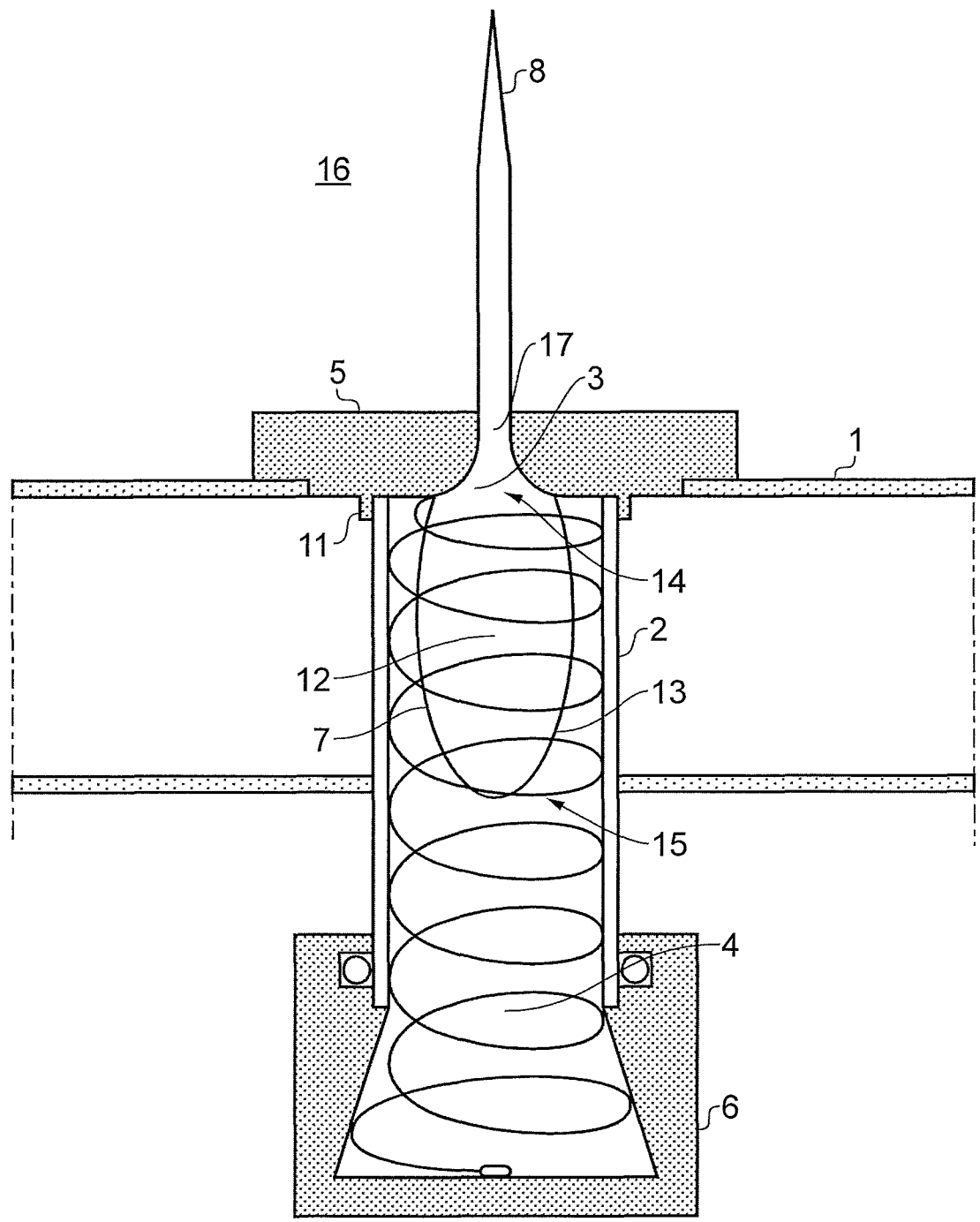
FIG. 1 is a facsimile of FIG. 2 of US 2004/0149700 showing a prior art plasma nozzle.
Figure 2:
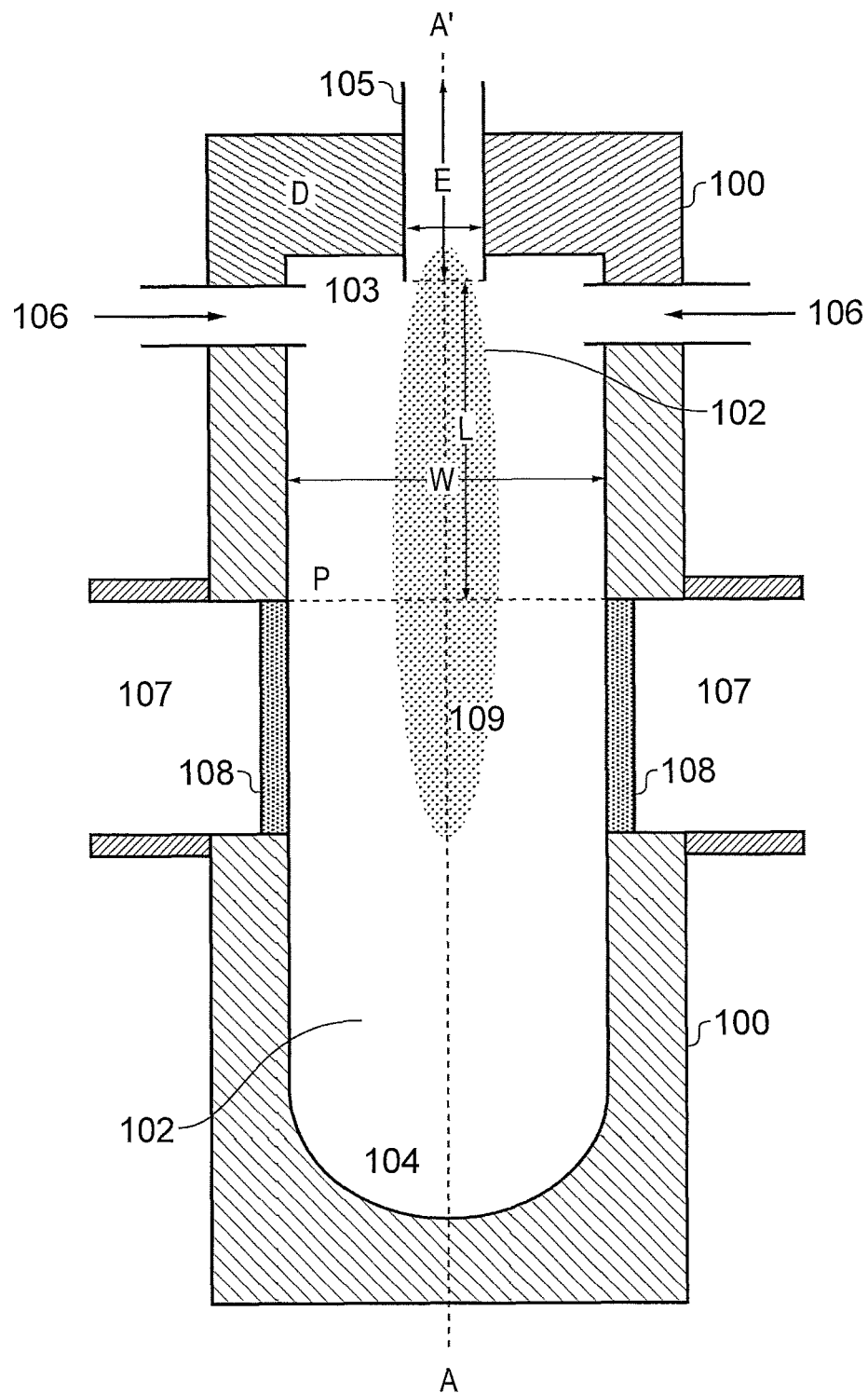
FIG. 2 is a schematic cross-section drawing illustrating the principle of the first and second aspect of the present invention.
Figure 3:
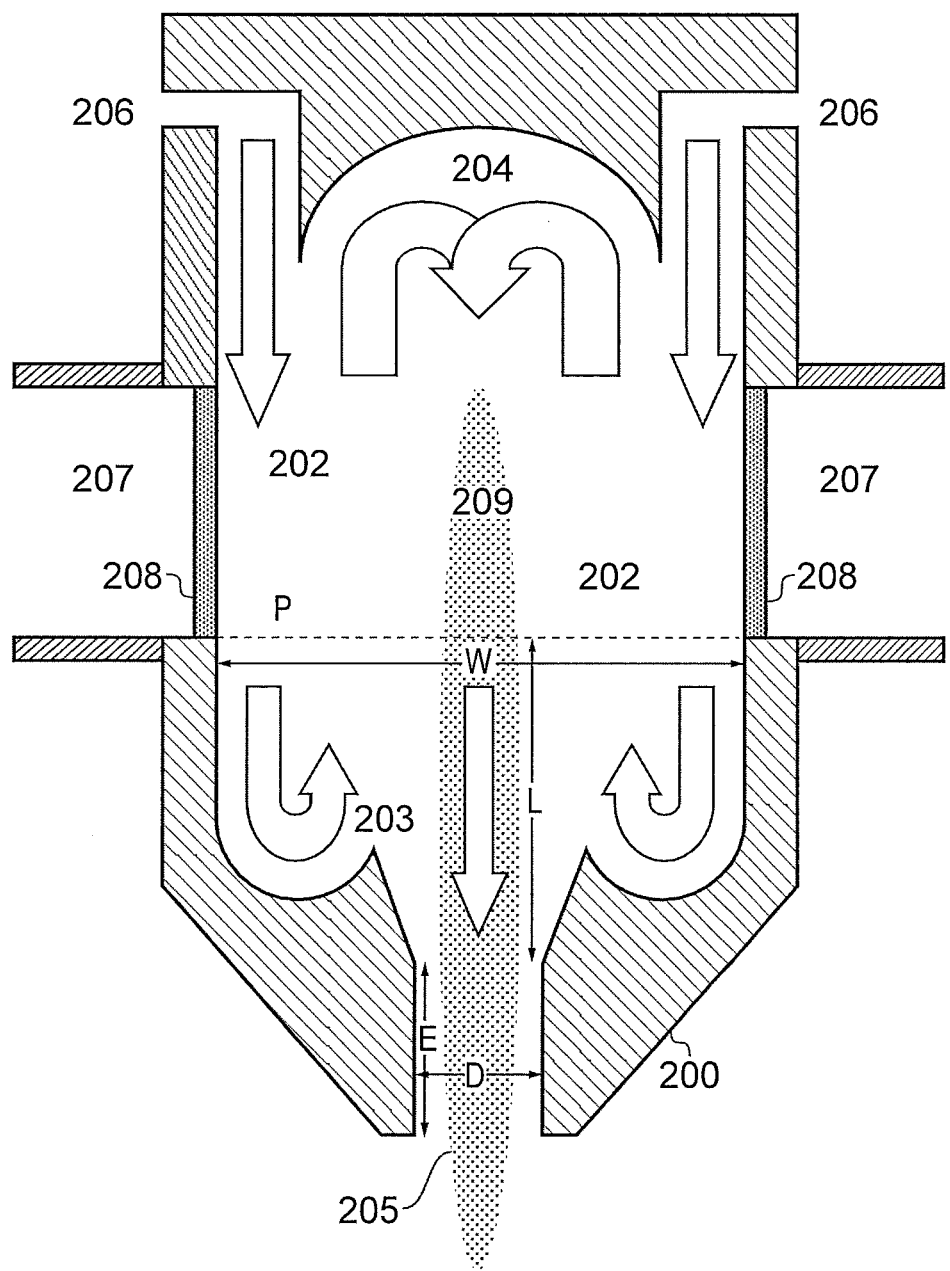
FIG. 3 is a schematic cross-section drawing illustrating the principle solution of a second example embodiment of the present invention which employs three co-axial vortex flows.
Figure 4:
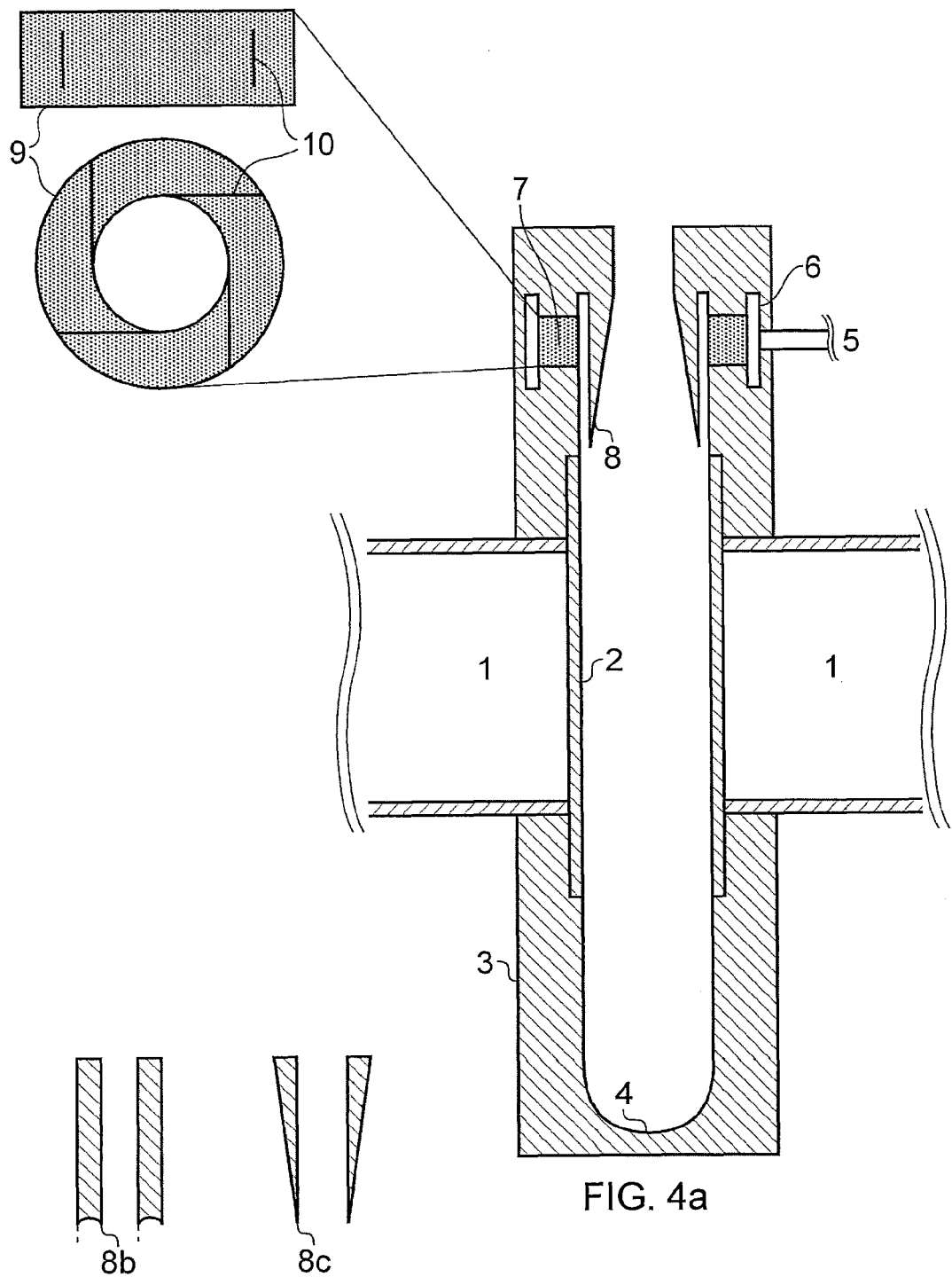

The example embodiment of the invention is illustrated in FIG. 4 a) which shows an elongated vessel 4 made of brass. The length of the choking cavity of the inner space of the elongated vessel 4 is 50 mm, the width is 25 mm, and the length of the exit channel is 29 mm and the diameter of the exit channel is 12 mm.

In the middle section of the vessel 4 there is made a recess in the brass wall and a waveguide 1 is inserted. The inner space of the vessel 4 is closed towards the waveguide 1 by a tubular wall segment 2 of thickness 2 mm made of boron nitride. The waveguide 1 is connected to a magnetron delivering microwaves with a wavelength of 174 mm and which is supplied with an energy of 6 kW.

In the first end, there is provided a downwardly protruding wall segment 8 forming a truncated conical narrowing of the inner space towards the exit channel. The wall segment 8 has cylindrical symmetry such that is forms a funnel-shaped guiding for the gas and/or plasma afterglow in second vortex flow in the upper section of the inner space. The walls segment 8 will also form an annular gap towards the wall of the elongated vessel 4. Thus, by locating the gas inlet 5 about the upper level of the wall segment 8, the wall segment 8 will form a downwardly oriented annular flow channel for the gas being injected. This helps stabilising and directing the gas to form the first vortex flow.

The gas inlet 5 leads to a first annular flow channel 6 formed in the bulk wall of the elongated vessel, functioning as a manifold distributing the gas around the periphery of the first end of the inner space. The first annular flow channel 6 is open towards an annular channel 7, which is open towards the downwardly oriented annular flow channel between the wall of the vessel and the wall segment 8. By inserting a number of four ring segments 9 of a right circular cylinder with a coaxial through-going hole dimensioned to exactly fit into the annular channel 7 and to form a gas tight closure towards the bulk wall of the elongated vessel 4 but which does not fully fill all space in the annular channel 7, it is formed through-going slits which connects flow channels between the manifold 6 and the downwardly oriented annular flow channel between the wall of the vessel and the wall segment 8. Each slit has a cross-sectional area of 15×0.01 mm$^2$ and the amount of gas supplied to the inlet 5 is 50 normal litres per minute.

The design of the exit channel may be employed to provide control over the vortex flow and therefore the plasma geometry and gas processing capability of the device. By employing an exit channel which has an opening (towards the inner space of the elongated vessel) shaped as a truncated funnel followed by a cylindrical section with constant cross-sectional area as shown in FIG. 4 a), it is obtained a maximized stabilized vortex suitable for use in cases where the gas that is to be processed produces inherently unstable plasmas, such as i.e. methane, $CH_4$.

An alternative design, shown in FIG. 4 b), has a cylindrical exit channel with constant cross-section area, but where the end wall of the exit channel is provided with a recess 8b which reflects gas which flows around the perimeter of the second vortex flow and makes the gas to enter the first vortex flow and subsequently make a second pass through the plasma forming zone. This design is advantageous in cases where the gas that is to be processed requires more intense exposure to the plasma.

A second alternative design is shown in FIG. 4 c). In this design, the exit channel is a cylindrical channel with constant cross-sectional area, but the outer wall of the exit channel is tapered such that wall thickness of the exit channel is decreased towards the lower end. This feature makes the flow channel for the first vortex flow to be gradually increased, which has the effect of narrowing the space available to the second vortex flow. Thus, this design is advantageous in cases where it is desirable to produce a second vortex with small diameter and correspondingly high flow velocity to have a long afterglow region into the reactor chamber. This design is preferable for reactants that produce a shorter lived afterglow zone.

Comparison Nozzle

A comparison nozzle based on the teaching of Jasinski et al [1] was made to compare the effect the present invention with prior art nozzles for treating gases by microwave induced plasma.

The comparison device is illustrated schematically in FIG. 5, and comprises an elongated body (tube) of quartz 220 and closed in the first end by a brass body 270. The gas which is to be processed is injected at the first end via inlet 250 and sent into a swirl flow running through the quartz tube. The quartz tube 220 is open at the second end such that the gas flows unhindered out of the tube. A waveguide 210 is located around the middle section of quartz tube 220 such that the gas flowing through the tube is excited and heated to form a plasma. The waveguide 210 was connected to a magnetron delivering microwaves with a wavelength of 174 mm and was supplied with an energy of 3 kW.

The gas inlet 250 leads to a first annular flow channel 260 formed in the bulk wall of the brass body 270, functioning as a manifold distributing the gas around the periphery of the first end of the inner space. The first annular flow channel 260 is open towards an annular channel, which is open towards the downwardly oriented annular flow channel formed between the wall of the vessel and the outer wall of the exit channel 230. The space of the annular channel is fully occupied by a metallic ring member 280 which has evenly spaced around its periphery four cylindrical through-going channels 290 forming a flow connection between the inner space of the elongated vessel and the flow channel 260. The through-going flow channels 290 is oriented such that the gas being fed through inlet 250 is injected tangentially at four equidistant points along the inner perimeter of the inner space at the height of the gas inlet 250, and thus form a first vortex flow which swirls along the inner wall of the elongated vessel down to the bottom section.

Comparison Test

A series of tests runs on the example embodiment presented above (FIG. 4) and the prior art plasma nozzle described above (FIG. 5) have been performed to verify the effect of the invention.

Testing methodology for both nozzles: The plasma was initiated using a metal rod placed into the plasma zone on a flow of 20 normal l/min of $N_2$ gas at around 1500 W of microwave energy. Upon initiation the rod was removed and the power was then increased steadily as a $CH_4$ flow was slowly introduced. The power and $CH_4$ flow rate was increased until the desired level was achieved and the $N_2$ flow rate was subsequently decreased until the desired flow rate was achieved. The reaction was then run until the system had equilibrated and samples of the exit gas mixture were taken for analysis of $H_2$ and $CH_4$ concentration. The results are given in Table 1.

From Table 1 we have that the obtained average conversion rate of $CH_4$ in these seven comparison tests is 47.2% when applying the prior art nozzle and 71.7% with the first example embodiment. This is an average increase of 52% of the effect of the nozzle. The corresponding figures for the $H_2$-yield are 30.6% for the prior art nozzle and 55.4% for the first example embodiment of the invention. This is an average increase of 81.8%.

TABLE 1

Comparison data for prior art nozzle and first example embodiment of the invention

| Flow rate [Nl/min] | | Microwave power | $CH_4$ conversion [%] | | $H_2$ formation efficiency [%] | |
| --- | --- | --- | --- | --- | --- | --- |
| $N_2$ | $CH_4$ | [W] | P* | E* | P* | E* |
| 12.3 | 2.7 | 1700 | 65.3 | 76.5 | 33.9 | 46.4 |
| 15.3 | 2.7 | 2100 | 52.4 | 77 | 34 | 65.5 |
| 17 | 3 | 1500 | 39.4 | 66.7 | 26.3 | 48.3 |
| 17 | 3 | 1700 | 48.1 | 71.8 | 31.1 | 55.2 |
| 17 | 3 | 1900 | 53.9 | 76.1 | 36.6 | 58.8 |
| 21.5 | 3.5 | 1700 | 38.5 | 69.2 | 26.3 | 59.2 |
| 26.1 | 3.5 | 1500 | 32.7 | 64.9 | 25.7 | 55.4 |

P* Prior art nozzle (FIG. 5)
E* Example embodiment of the present invention (FIG. 4)

REFERENCE

1. Jasinski et al. (2008), "Hydrogen Production via Methane Reforming using various Microwave Plasma Sources", *Chem. Listy.*, 102, pp. 1332-1337.

The invention claimed is:

1. A method for processing a gas, wherein the method comprises:
   employing an elongated vessel with an inner space of cylindrical symmetry, wherein the elongated vessel:
   i) protrudes through a microwave chamber,
   ii) walls of the elongated vessel not in contact with the microwave chamber are opaque to microwave radiation,
   iii) walls of the elongated vessel that penetrate into the microwave chamber are transparent to microwave radiation,
   iv) the elongated vessel has, at a first end, a co-axial elongated cylindrical exit channel with an inner diameter, D, equal to or less than a factor of $\frac{1}{16}$ of a wavelength of an applied microwave field within the microwave chamber, and a length, E, equal to or less than a factor of $(n+\frac{1}{8})$, wherein $n \in \{0, 1, 2, 3\}$, of the wavelength of the applied microwave field within the microwave chamber, and
   v) the elongated vessel is closed at a second end opposite the first end by a bottom wall,
   injecting the gas that is to be processed such that the gas forms a first vortex flow running along an inner wall of the inner space of the elongated vessel and reflects from the bottom wall at the second end to form a second vortex flow of the gas that is to be processed running along a center axis of the elongated vessel from the bottom wall and out the exit channel at the first end, and
   forming a standing microwave in the microwave chamber aligned to form a wave crest at the center axis of the elongated vessel in an area of the elongated vessel that is transparent to microwave energy capable to excite at least a portion of the gas in the second vortex to form a microwave non-thermal plasma.

2. The method according to claim 1, wherein the elongated vessel comprises:
   a width, W, of the inner space of the elongated vessel is in a range of at least one selected from the group consisting of a factor of $(n+\frac{1}{32})$ to $(n+\frac{1}{8})$, a factor of $(n+\frac{1}{16})$ to $(n+\frac{1}{8})$, and a factor of $(n+\frac{1}{12})$ to $(n+\frac{1}{8})$, wherein $n \in \{0, 1, 2, 3\}$, of the wavelength of the standing microwave within the microwave chamber, and
   a length, L, of the inner space of the elongated vessel is in a range of at least one selected from the group consisting of a factor of $(n+\frac{1}{16})$ to $(n+\frac{1}{4})$, a factor of $(n+\frac{1}{8})$ to $(n+\frac{1}{4})$, and a factor of $(n+\frac{1}{6})$ to $(n+\frac{1}{4})$, wherein $n \in \{0, 1, 2, 3\}$, of the wavelength of the standing microwave within the microwave chamber.

3. The method according to claim 1, wherein, instead of injecting the gas that is to be processed at the first end of the elongated vessel, the gas to be processed is injected at a position in proximity of the second end of the elongated vessel such that the gas forms a first vortex flow running along an inner wall of the inner space of the vessel and reflects from a distal part of the first end to form a second vortex flow running co-axially inside the first vortex flow, and reflects from the bottom wall at the second end to form a third co-axial vortex flow running along the center axis of the vessel from the bottom wall of the vessel and out the exit channel at the first end.

4. The method according to claim 1, wherein the gas to be processed is at least one selected from the group consisting of natural gas, methane, ethane, propane, and butane.

5. A device for processing a gas, wherein the device comprises:
   a microwave chamber coupled to a source for microwave radiation and configured to form a standing microwave therein, the source for microwave radiation comprising a coaxial magnetron supplied with an energy between 0.1 kW and 500 kW and generates microwave radiation with a frequency between 0.6 GHz and 10 GHz; and an elongated vessel with an inner space of cylindrical symmetry, wherein:

the elongated vessel protrudes through the microwave chamber such that a longitudinal center axis of the elongated vessel is oriented substantially normal to a propagation direction of the standing microwave in the microwave chamber, walls of the elongated vessel not in contact with the microwave chamber are opaque to microwave radiation, walls of the elongated vessel that penetrate into the microwave chamber are transparent to microwave radiation, the elongated vessel is closed at a second end opposite a first end by a bottom wall, the elongated vessel has, at the first end, a co-axial elongated cylindrical exit channel with an inner diameter, D, equal to or less than a factor of $1/16$ of a wavelength of an applied microwave field within the microwave chamber, and a length, E, equal to or less than a factor of $(n+1/8)$, wherein $n \in \{0, 1, 2, 3\}$, of the wavelength of the applied microwave field within the microwave chamber, the elongated vessel has an inlet for injection of the gas that is to be processed located at a position in proximity of the first end of the elongated vessel, and injects the gas forming a first vortex flow running along an inner wall of the inner space of the elongated vessel to the bottom wall of the second end, and reflects from the bottom wall to form a second vortex flow of the gas running along the longitudinal center axis of the vessel from the bottom wall of the elongated vessel and out an exit channel at the first end, and the elongated vessel penetrates through the microwave chamber in a position such that the standing microwave within the microwave chamber has a wave crest at the longitudinal center axis of the elongated vessel.

6. The device according to claim 5, wherein the elongated vessel comprises:

a second inlet for injection of the gas that is to be processed located at a position in proximity of the second end of the elongated vessel, and a curved wall segment forming an annular semi-tube facing the second end located at a peripheral section of the elongated vessel at the first end, such that the injected gas forms a first vortex flow running along the inner wall of the inner space of the vessel to the curved wall segment and reflects from the curved wall segment forming a second vortex flow of the gas running towards the second end of the elongated vessel and reflects again forming a third vortex flow running along the longitudinal center axis of the elongated vessel from the bottom wall of the elongated vessel and out the exit channel at the first end.

7. The device according to claim 5, wherein:

a width, W, of the inner space of the elongated vessel is in a range of at least one selected from the group consisting of a factor of $(n+1/32)$ to $(n+1/8)$, a factor of $(n+1/16)$ to $(n+1/8)$, and a factor of $(n+1/12)$ to $(n+1/8)$, wherein $n \in \{0, 1, 2, 3\}$, of the wavelength of the standing microwave within the microwave chamber, and a length, L, of the inner space of the elongated vessel is in a range of at least one selected from the group consisting of a factor of $(n+1/16)$ to $(n+1/4)$, a factor of $(n+1/8)$ to $(n+1/4)$, and a factor of $(n+1/6)$ to $(n+1/4)$, wherein $n \in \{1, 2, 3\}$, of the wavelength of the standing microwave within the microwave chamber.

8. The device according to claim 5, wherein the source for microwave radiation:

comprises a coaxial magnetron supplied with an energy between 0.5 kW to 120 kW, preferably 1 kW to 75 kW, and generates microwave radiation with a frequency in the range of 0.9 GHz to 2.5 GHz.

9. The device according to claim 5, wherein the walls of the elongated vessel not in contact with the microwave chamber comprise a material of at least one selected from the group consisting of: brass, copper, steel, aluminium, and alumina.

10. The device according to claim 5, wherein the walls of a mid-section of the elongated vessel comprise a material of at least one selected from the group consisting of: polytetrafluoroethylene, boron nitride, quartz, silica, and alumina.

11. The device according to claim 5, wherein the inlet is designed to provide a tangential injection of the gas that is to be processed into the inner space of the elongated vessel.

12. The device according to claim 5, wherein design of the exit channel is at least one selected from the group consisting of: shaped as a truncated funnel followed by a cylindrical section with constant cross-sectional area and shaped to have a constant cross-section area and recess in an end wall of the exit channel.

13. The device according to claim 5, wherein design of the exit channel is shaped as a cylindrical channel with constant cross-sectional area with a tapered outer wall of the exit channel such that wall thickness of the exit channel decreases towards a lower end.

* * * * *

UNITED STATES PATENT AND TRADEMARK OFFICE
CERTIFICATE OF CORRECTION

PATENT NO. : 9,293,302 B2
APPLICATION NO. : 14/180981
DATED : March 22, 2016
INVENTOR(S) : Philip John Risby et al.

Page 1 of 1

It is certified that error appears in the above-identified patent and that said Letters Patent is hereby corrected as shown below:

In the Specification:

At column 5, line number 47, the words "{1, 2, 3}" should read -- {0, 1, 2, 3} --.

Signed and Sealed this
Twenty-eighth Day of June, 2016

Michelle K. Lee
*Director of the United States Patent and Trademark Office*